(12) United States Patent
Igarashi et al.

(10) Patent No.: US 7,001,676 B2
(45) Date of Patent: *Feb. 21, 2006

(54) LIGHT-EMITTING DEVICE

(75) Inventors: Tatsuya Igarashi, Kanagawa-ken (JP); Xuepeng Qiu, Changchun (CN)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 125 days.

This patent is subject to a terminal disclaimer.

(21) Appl. No.: 10/191,079

(22) Filed: Jul. 10, 2002

(65) Prior Publication Data

US 2003/0039858 A1    Feb. 27, 2003

(30) Foreign Application Priority Data

Jul. 11, 2001   (JP) .............................. 2001-211270

(51) Int. Cl.
*H05B 33/12*   (2006.01)

(52) U.S. Cl. ...................... 428/690; 428/917; 313/504; 313/506; 257/102; 257/103

(58) Field of Classification Search ................ 428/690, 428/917; 313/504, 506; 257/102, 103
See application file for complete search history.

(56) References Cited

U.S. PATENT DOCUMENTS

| | | | |
|---|---|---|---|
| 6,461,747 B1 * | 10/2002 | Okada et al. ................ | 428/690 |
| 6,635,364 B1 * | 10/2003 | Igarashi ....................... | 428/690 |
| 6,656,608 B1 * | 12/2003 | Kita et al. ................... | 428/690 |
| 6,656,612 B1 * | 12/2003 | Okada et al. ................ | 428/690 |
| 6,660,410 B1 * | 12/2003 | Hosokawa ................... | 428/690 |
| 6,693,295 B1 * | 2/2004 | Nii ............................... | 257/40 |
| 6,780,529 B1 * | 8/2004 | Kimura ....................... | 428/690 |
| 2002/0024293 A1 | 2/2002 | Igarashi et al. ............. | 313/483 |
| 2002/0028329 A1 | 3/2002 | Ise et al. ..................... | 428/336 |
| 2002/0055014 A1 * | 5/2002 | Okada et al. ................ | 428/690 |

OTHER PUBLICATIONS

Baldo, M.A. et al., "Very high-efficiency green organic light-emitting devices based on electrophosphorescence", Applied Physics Letters, vol. 75, No. 1, Jul. 5, 1999, pp. 4-6.
Tang, C.W. et al., "Organic electroluminescent diodes", Applied Physics Letters, vol. 51, No. 12, Sep. 21, 1987, pp. 913-915.

* cited by examiner

*Primary Examiner*—Marie Yamnitzky
(74) *Attorney, Agent, or Firm*—Sughrue Mion, PLLC

(57) ABSTRACT

A light-emitting device comprising a pair of electrodes and one or more organic layers disposed therebetween, one or more organic layers comprising a light-emitting layer, wherein the light-emitting device utilizes a triplet exciton for light emission and comprises at least one compound represented by the following formula (1):

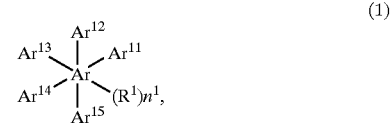

wherein each of $Ar^{11}$, $Ar^{12}$, $Ar^{13}$, $Ar^{14}$ and $Ar^{15}$ represents an aryl group or a heteroaryl group; Ar represents an aryl group; $R^1$ represents a substituent; and $n^1$ represents an integer of 0 or more.

75 Claims, No Drawings

LIGHT-EMITTING DEVICE

FIELD OF THE INVENTION

The present invention relates to a light-emitting device converting electric energy to light, useful for indicating elements, displays, backlights, electro-photography, illumination light sources, recording light sources, exposing light sources, reading light sources, road signs and markings, signboards, interiors, optical communications, etc.

BACKGROUND OF THE INVENTION

Various display devices have been actively researched and developed in recent years. In particular, much attention is paid to organic electroluminescence (EL) devices capable of emitting light with a high luminance by applying low voltage. For example, a light-emitting device comprising organic thin layers formed by vapor-depositing organic compounds is disclosed in Applied Physics Letters, 51, 913 (1987). This light-emitting device has a laminate structure in which an electron-transporting material of tris(8-hydroxyquinolinato) aluminum complex (Alq) and a hole-transporting material of an amine compound are disposed between electrodes, thereby exhibiting more excellent light-emitting properties than those of conventional light-emitting devices having single-layer structures.

Applications of the organic EL devices to color display devices or white light sources have been actively studied in recent years. Light-emitting properties concerning each of blue, green and red lights should be improved to produce a high-performance color display device or white light source. Known as a light-emitting device with improved light-emitting properties is a green light-emitting device disclosed in Applied Physics Letters, 75, 4 (1999), which uses a particular ortho-metalated iridium complex, Ir(ppy)$_3$ (Tris-Ortho-Metalated Complex of Iridium (III) with 2-Phenylpyridine). This green light-emitting device exhibits a high external quantum efficiency of 8%, which exceeds limit of external quantum efficiency of conventional light-emitting devices, 5%. However, the green light-emitting device using Ir(ppy)$_3$ emits only a green light to have a narrow applicability as a display device. Thus, expectations are high for the development of a light-emitting device that can emit light of the other color with high efficiency. Turning to the blue light-emitting devices, though many devices using distyrylarylene or a derivative thereof such as DPVBi (4,4'-bis(2, 2'-diphenylvinyl)-biphenyl) have been proposed, the upper limit of the external quantum efficiency has been 5%. Development of the blue light-emitting device exhibiting the external quantum efficiency exceeding 5% has been highly expected because it will contribute for the progress of the color organic EL device and the white light-emitting device excellent in the efficiency.

OBJECT OF THE INVENTION

An object of the present invention is to provide a light-emitting device, particularly a blue light-emitting device and a multicolor light-emitting device, excellent in light-emitting properties.

SUMMARY OF THE INVENTION

As a result of intense research in view of the above object, the inventors have found that a light-emitting device comprising a particular aromatic compound for utilizing a triplet exciton for light emission is excellent in light-emitting properties. The present invention has been accomplished by this finding.

Thus, the light-emitting device of the present invention comprises a pair of electrodes and one or more organic layers comprising a light-emitting layer disposed therebetween for utilizing a triplet exciton for light emission, and comprises at least one compound represented by the following formula (1):

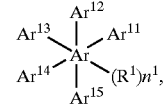

(1)

wherein each of $Ar^{11}$, $Ar^{12}$, $Ar^{13}$, $Ar^{14}$ and $Ar^{15}$ represents an aryl group or a heteroaryl group; Ar represents an aryl group; $R^1$ represents a substituent; and $n^1$ represents an integer of 0 or more.

In the formula (1), Ar preferably represents a phenyl group, a naphthyl group, a phenanthryl group or an anthryl group, more preferably a phenyl group.

In the formula (1), each of $Ar^{11}$, $Ar^{12}$, $Ar^{13}$, $Ar^{14}$ and $Ar^{15}$ preferably represents a phenyl group. Alternatively, each of $Ar^{11}$, $Ar^{12}$, $Ar^{13}$, $Ar^{14}$ and $Ar^{15}$ preferably represents a pyridyl group, a pyrazinyl group, a pyrimidyl group, or a triazinyl group.

In the formula (1), $n^1$ preferably represents an integer of 0 to 5, more preferably 1.

The compound of the formula (1) is represented preferably by the following formula (2).

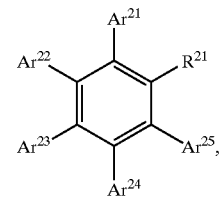

(2)

wherein each of $Ar^{21}$, $Ar^{22}$, $Ar^{23}$, $Ar^{24}$ and Ar represents an aryl group or a heteroaryl group; and $R^{21}$ represents a hydrogen atom or a substituent.

In the formula (2), each of $Ar^{21}$, $Ar^{22}$, $Ar^{23}$, $Ar^{24}$ and $Ar^{25}$ preferably represents a phenyl group. Alternatively, each of $Ar^{21}$, $Ar^{22}$, $Ar^{23}$, $Ar^{24}$ and $Ar^{25}$ preferably represents a pyridyl group, a pyrazinyl group, a pyrimidyl group, or a triazinyl group.

In the formula (2), $R^{21}$ preferably represents an alkyl group, an aryl group or a heteroaryl group.

The compound of the formula (1) is represented more preferably by the following formula (3).

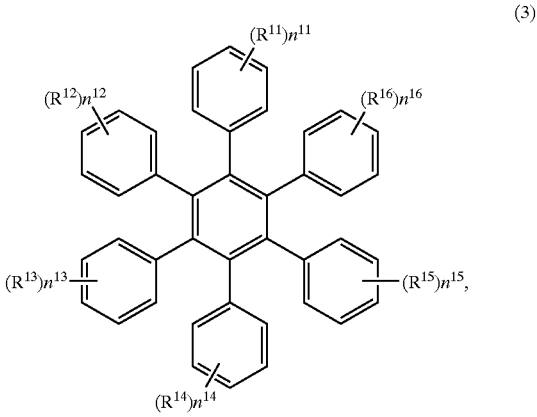

(3)

wherein each of $R^{11}$, $R^{12}$, $R^{13}$, $R^{14}$, $R^{15}$ and $R^{16}$ represents a substituent; and each of $n^{11}$, $n^{12}$, $n^{13}$, $n^{14}$, $n^{15}$ and $n^{16}$ represents an integer of 0 to 5.

In the formula (3), each of $R^{11}$, $R^{12}$, $R^{13}$, $R^{14}$, $R^{15}$ and $R^{16}$ is preferably an alkyl group, each of $n^{11}$, $n^{12}$, $n^{13}$, $n^{14}$, $n^{15}$ and $n^{16}$ is preferably an integer of 0, 1 or 2, and each of $n^{11}$, $n^{12}$, $n^{13}$, $n^{14}$, $n^{15}$ and $n^{16}$ is preferably an integer of 0 or 1.

In the light-emitting device of the present invention, the organic layer comprising the compound represented by the formula (1) is formed preferably by a coating method.

The organic layer comprising the compound represented by the formula (1) is a light-emitting layer, a hole-transporting layer or an electron-transporting layer.

A $T_1$ level, an energy level at the lowest triplet excited state, of the compound represented by the formula (1) is 60 to 90 kcal/mol.

The light-emitting device of the present invention preferably exhibits an emission peak in a wavelength range of 390 to 495 nm.

The content of the compound of the formula (1) in the organic layers comprising the light-emitting layer is 50 to 99.9% by mass as a host material.

The content of said compound of the formula (1) in the organic layer comprising said light-emitting layer is 50 to 100% by mass as a charge-transporting material.

The light-emitting device utilizes a transition metal complex in a triplet excited state for light emission.

A center metal of the transition metal complex is preferably a rare earth metal. The center metal of the transition metal complex is preferably selected from the group consisting of iridium, platinum, rhenium and ruthenium. The transition metal complex is an ortho-metallation complex.

DETAILED DESCRIPTION OF THE PREFERRED EMBODIMENTS

The light-emitting device of the present invention comprises a pair of electrodes and one or more organic layers disposed therebetween, the one or more organic layers comprising a light-emitting layer. The light-emitting device comprises at least one compound represented by the following formula (1). The light-emitting device of the present invention utilizes a triplet exciton for light emission. The compound represented by the formula (1) is hereinafter referred to as "compound (1)."

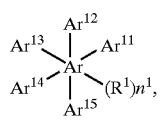

(1)

wherein each of $Ar^{11}$, $Ar^{12}$, $Ar^{13}$, $Ar^{14}$ and $Ar^{15}$ represents an aryl group or a heteroaryl group, preferably an aryl group. Alternatively, each of $Ar^{11}$, $Ar^{12}$, $Ar^{13}$, $Ar^{14}$ and $Ar^{15}$ may preferably be a pyridyl group, a pyrazinyl group, a pyrimidyl group, or a triazinyl group. The aryl group and the heteroaryl group preferably have a monocyclic structure. Examples of the aryl groups include a phenyl group, a naphthyl group, an anthryl group, a phenanthryl group, a pyrenyl group, a perylenyl group, a chrysenyl group, a triphenylenyl group, a benzoanthryl group, a benzophenanthryl group, etc. Preferable among them are a phenyl group, a naphthyl group, an anthryl group and a phenanthryl group, more preferable are a phenyl group and a naphthyl group, and particularly preferable is a phenyl group. Examples of the heteroaryl groups include a pyridyl group, a pyrazinyl group, a pyrimidyl group, a quinolyl group, a quinoxalyl group, a quinazolyl group, an acridyl group, a phenanthridyl group, a phthalazyl group, a phenanthrolyl group, a triazyl group, etc. Preferable among them are a pyridyl group and a triazyl group. Each of $Ar^{11}$, $Ar^{12}$, $Ar^{13}$, $Ar^{14}$ and $Ar^{15}$ may have a substituent, and examples of the substituents may be the same as those of $R^1$, which will be described later.

In the formula (1), Ar represents an aryl group. Ar is preferably a phenyl group, a naphthyl group, a phenanthryl group or an anthryl group, more preferably a phenyl group.

In the formula (1), $R^1$ represents a substituent, whose examples include alkyl groups, the number of carbon atoms thereof being preferably 1 to 30, more preferably 1 to 20, particularly 1 to 10, such as a methyl group, an ethyl group, an isopropyl group, a t-butyl group, a n-octyl group, a n-decyl group, a n-hexadecyl group, a cyclopropyl group, a cyclopentyl group and a cyclohexyl group; alkenyl groups, the number of carbon atoms thereof being preferably 2 to 30, more preferably 2 to 20, particularly 2 to 10, such as a vinyl group, an allyl group, a 2-butenyl group and a 3-pentenyl group; alkynyl groups, the number of carbon atoms thereof being preferably 2 to 30, more preferably 2 to 20, particularly 2 to 10, such as a propargyl group and a 3-pentynyl group; aryl groups, the number of carbon atoms thereof being preferably 6 to 30, more preferably 6 to 20, particularly 6 to 12, such as a phenyl group, a p-methylphenyl group, a naphthyl group and an anthranyl group; amino groups, the number of carbon atoms thereof being preferably 0 to 30, more preferably 0 to 20, particularly 0 to 10, such as an unsubstituted amino group, a methylamino group, a dimethylamino group, a diethylamino group, a dibenzylamino group, a diphenylamino group and a ditolylamino group; alkoxy groups, the number of carbon atoms thereof being preferably 1 to 30, more preferably 1 to 20, particularly 1 to 10, such as a methoxy group, an ethoxy group, a butoxy group and a 2-ethylhexyloxy group; aryloxy groups, the number of carbon atoms thereof being preferably 6 to 30, more preferably 6 to 20, particularly 6 to 12, such as a phenyloxy group, a 1-naphthyloxy group and a 2-naphthyloxy group; heteroaryloxy groups, the number of carbon atoms thereof being preferably 1 to 30, more preferably 1 to 20, particularly 1 to 12, such as a pyridyloxy group, a pyrazinyloxy group, a pyrimidyloxy group and a quinolyloxy group; acyl groups, the number of carbon atoms thereof being preferably 1 to 30, more preferably 1 to 20, particularly 1 to 12, such as an acetyl group, a benzoyl group, a formyl group and a pivaloyl group; alkoxycarbonyl groups, the number of carbon atoms thereof being preferably 2 to 30, more preferably 2 to 20, particularly 2 to 12, such as a methoxycarbonyl group and an ethoxycarbonyl group; aryloxycarbonyl groups, the number of carbon atoms thereof being preferably 7 to 30, more preferably 7 to 20, particularly 7 to 12, such as a phenyloxycarbonyl group; acyloxy groups, the number of carbon atoms thereof being preferably 2 to 30, more preferably 2 to 20, particularly 2 to 10, such as an acetoxy group and a benzoyloxy group; acylamino groups, the number of carbon atoms thereof being preferably 2 to 30, more preferably 2 to 20, particularly 2 to 10, such as an acetylamino group and a benzoylamino group; alkoxycarbonylamino groups, the number of carbon atoms thereof being preferably 2 to 30, more preferably 2 to 20, particularly 2 to 12, such as a methoxycarbonylamino group; aryloxycarbonylamino groups, the number of carbon atoms thereof being preferably 7 to 30, more preferably 7 to 20, particularly 7 to 12, such as a phenyloxycarbonylamino group; sulfonylamino groups, the number of carbon atoms thereof being preferably 1 to 30, more preferably 1 to 20, particularly 1 to 12, such as a methanesulfonylamino group and a benzenesulfonylamino group; sulfamoyl groups, the number of carbon atoms thereof being preferably 0 to 30, more preferably 0 to 20, particularly 0 to 12, such as an unsubstituted sulfamoyl group, a methylsulfamoyl group, a dimethylsulfamoyl group and a phenylsulfamoyl group; carbamoyl groups, the number of carbon atoms thereof being preferably 1 to 30, more preferably 1 to 20, particularly 1 to 12, such as an unsubstituted carbamoyl group, a methylcarbamoyl group, a diethylcarbamoyl group and a phenylcarbamoyl group; alkylthio groups, the number of carbon atoms thereof being preferably 1 to 30, more preferably 1 to 20, particularly 1 to 12, such as a methylthio group and an ethylthio group; arylthio groups, the number of carbon atoms thereof being preferably 6 to 30, more preferably 6 to 20, particularly 6 to 12, such as a phenylthio group; heteroarylthio groups, the number of carbon atoms thereof being preferably 1 to 30, more preferably 1 to 20, particularly 1 to 12, such as a pyridylthio group, a 2-benzimidazolylthio group, a 2-benzoxazolylthio group and a 2-benzthiazolylthio group; sulfonyl groups, the number of carbon atoms thereof being preferably 1 to 30, more preferably 1 to 20, particularly 1 to 12, such as a mesyl group and a tosyl group; sulfinyl groups, the number of carbon atoms thereof being preferably 1 to 30, more preferably 1 to 20, particularly 1 to 12, such as a methane sulfinyl group and a benzene sulfinyl group; ureide groups, the number of carbon atoms thereof being preferably 1 to 30, more preferably 1 to 20, particularly 1 to 12, such as an unsubstituted ureide group, a methylureide group and a phenylureide group; phosphoric amide groups, the number of carbon atoms thereof being preferably 1 to 30, more preferably 1 to 20, particularly 1 to 12, such as a diethylphosphoric amide group and a phenylphosphoric amide group; a hydroxyl group; a mercapto group; halogen atoms such as a fluorine atom, a chlorine atom, a bromine atom and an iodine atom; a cyano group; a sulfo group; a carboxyl group; a nitro group; a hydroxamic acid group; a sulfino group; a hydrazino group; an imino group; heterocyclic groups that may have a nitrogen atom, an oxygen atom, a sulfur atom, etc. as a hetero atom, the number of carbon atoms thereof being preferably 1 to 30, more preferably 1 to 12, such as an imidazolyl group, a pyridyl group, a quinolyl group, a furyl group, a thienyl group, a piperidyl group, a morpholino group, a benzoxazolyl group, a benzimidazolyl group, a benzthiazolyl group, a carbazolyl group and an azepinyl group; silyl groups, the number of carbon atoms thereof being preferably 3 to 40, more preferably 3 to 30, particularly 3 to 24, such as a trimethylsilyl group and a triphenylsilyl group; etc. The substituent may be further substituted. $R^1$ is preferably an alkyl group, an aryl group (particularly a phenyl group) or a heteroaryl group (particularly a pyridyl group or a triazyl group).

In the formula (1), $n^1$ represents an integer of 0 or more. $n^1$ is preferably an integer of 0 to 10, more preferably an integer of 0 to 5, particularly 1.

The compound (1) is represented preferably by the following formula (2), more preferably by the following formula (3).

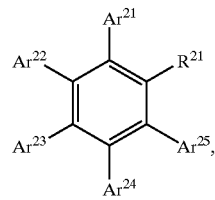

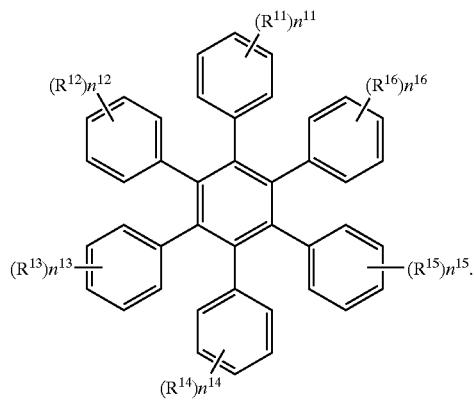

In the formula (2), $Ar^{21}$, $Ar^{22}$, $Ar^{23}$, $Ar^{24}$ and $Ar^{25}$ are the same as above-mentioned $Ar^{11}$, $Ar^{12}$, $Ar^{13}$, $Ar^{14}$ and $Ar^{15}$ with respect to the meaning and preferred embodiments. $R^{21}$ represents a hydrogen atom or a substituent, and is preferably an alkyl group, an aryl group or a heteroaryl group.

In the formula (3), each of $R^{11}$, $R^{12}$, $R^{13}$, $R^{14}$, $R^{15}$ and $R^{16}$ represents a substituent, examples thereof being the same as those of $R^1$. Each of $R^{11}$, $R^{12}$, $R^{13}$, $R^{14}$, $R^{15}$ and $R^{16}$ is preferably an alkyl group. Each of $n^{11}$, $n^{12}$, $n^{13}$, $n^{14}$, $n^{15}$ and $n^{16}$ is an integer of 0 to 5, preferably 0, 1 or 2, more preferably 0 or 1.

The compound (1) is preferably a low-molecular-weight compound though it may be an oligomer or a polymer. In a case where the compound (1) is a polymer (or an oligomer), its weight-average molecular weight determined with polystyrene as a standard is preferably 1,000 to 5,000,000, more preferably 2,000 to 1,000,000, particularly 3,000 to 100,000. The polymer may contain a moiety represented by the formula (1) in its main or side chain. The polymer may be a homopolymer or a copolymer.

A $T_1$ level, an energy level at the lowest triplet excited state, of the compound (1) is preferably 60 to 90 kcal/mol (251.4 to 377.1 kJ/mol), more preferably 62 to 85 kcal/mol (259.78 to 356.15 kJ/mol), particularly 65 to 80 kcal/mol (272.35 to 335.2 kJ/mol).

Each of the compounds represented by the formula (1), compounds used in the electron-transporting layer and compounds used in the hole-transporting layer has a glass transition temperature Tg of preferably 100° C. or higher, more preferably 120° C. or higher, further preferably 140° C. or higher, particularly preferably 160° C. or higher.

Specific examples of the compound (1) are illustrated below without intention of restricting the scope of the present invention defined by the claims attached hereto.

-continued
(1-1)
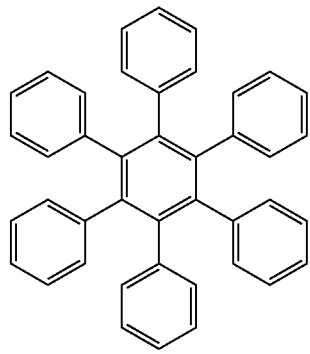
(1-2)
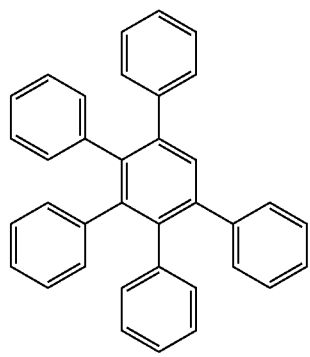
(1-3)
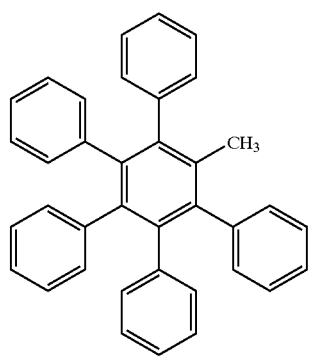
(1-4)
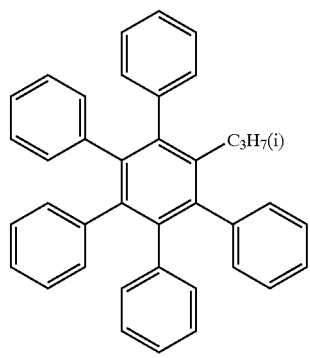
(1-5)
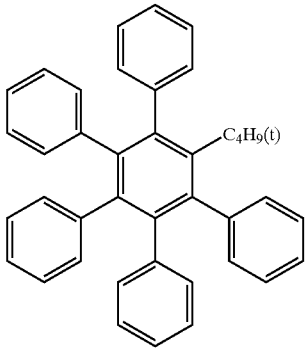
(1-6)
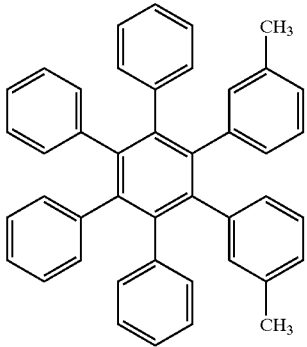
(1-7)
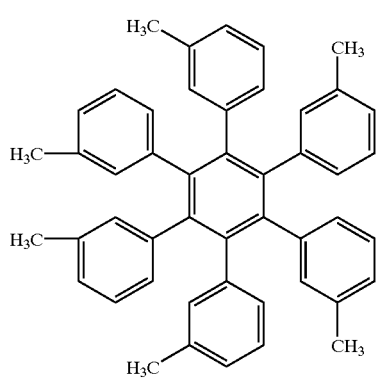
(1-8)
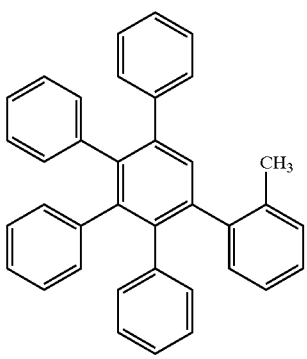

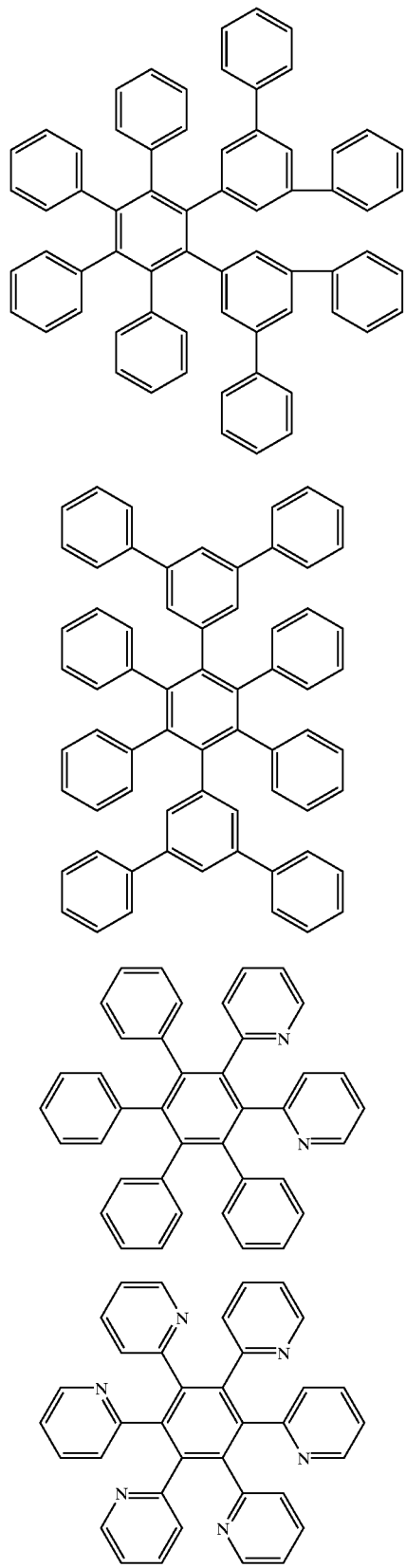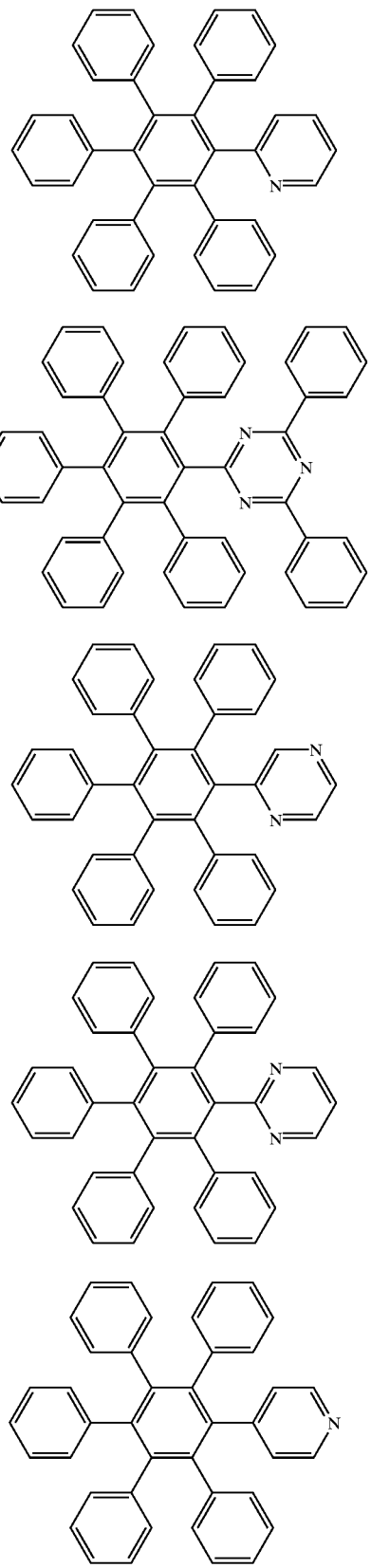

-continued
(1-18)
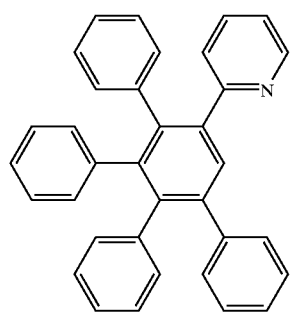
(1-19)
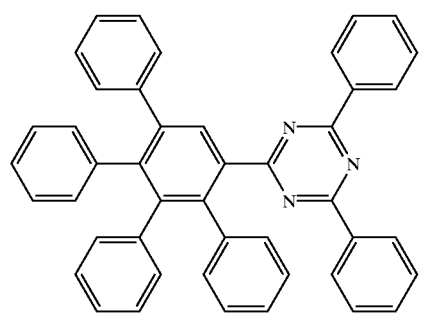
(1-20)
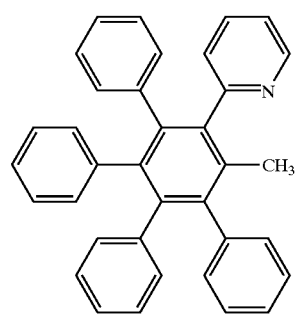
(1-21)
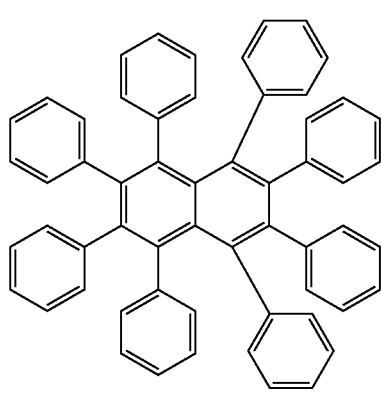
(1-22)
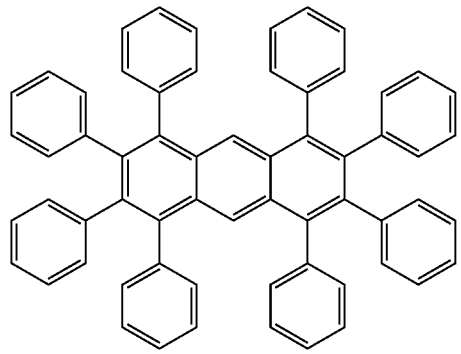
(1-23)
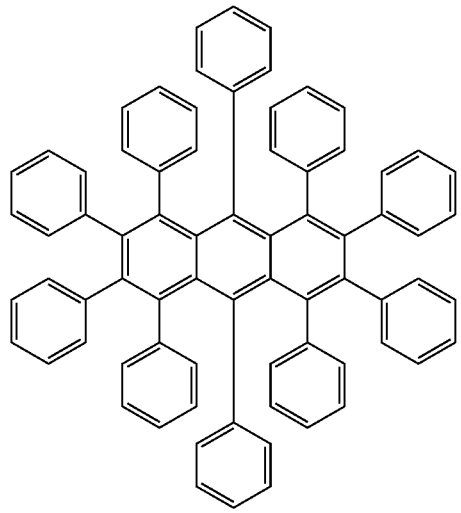
(1-24)
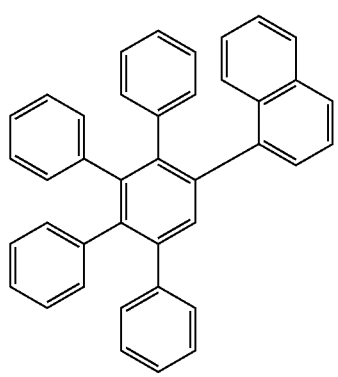
(1-25)
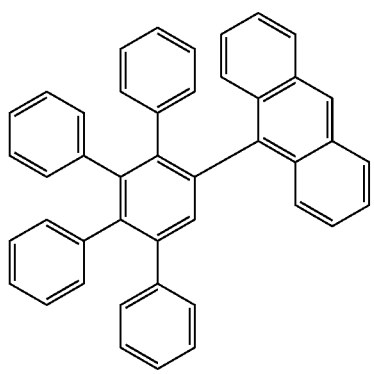

-continued
(1-26)
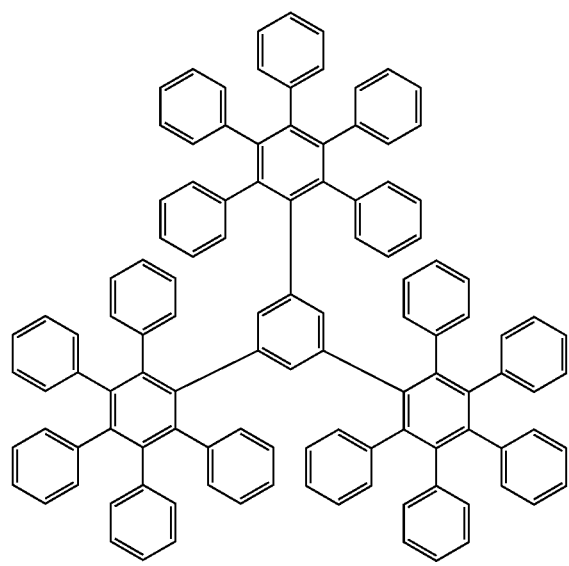
(1-28)
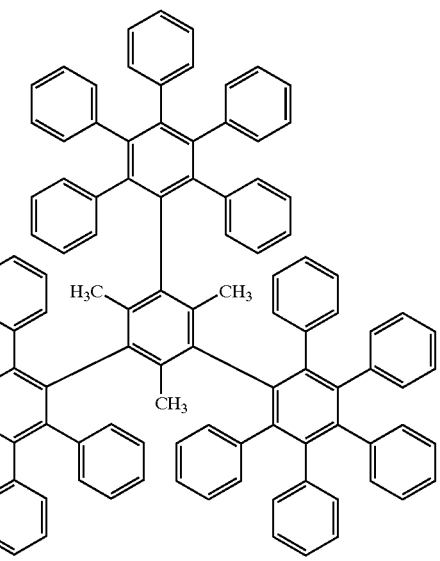
(1-27)
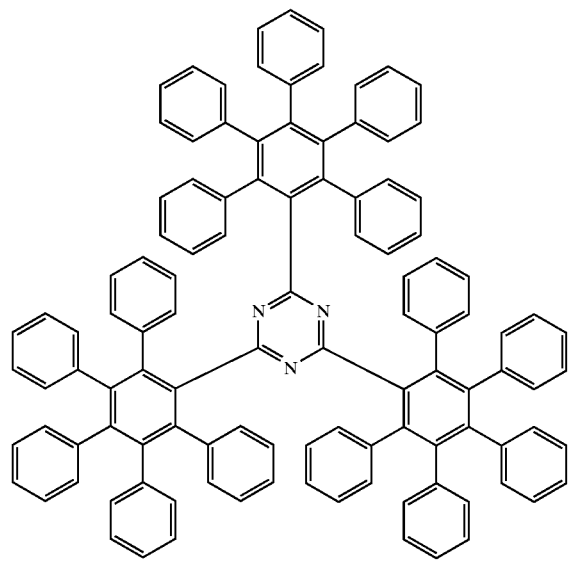
(1-29)
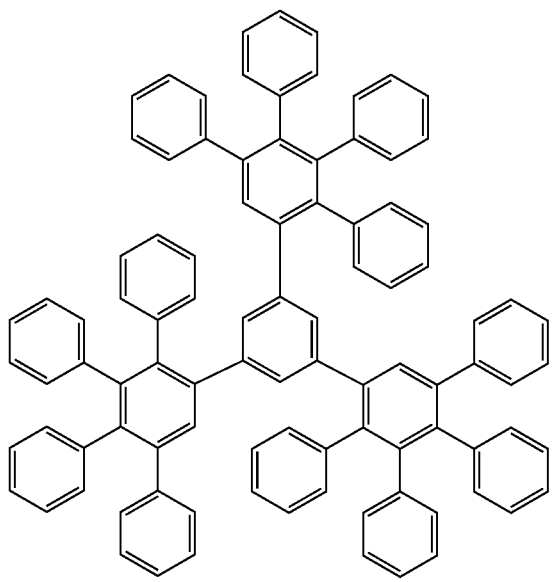

(1-30)
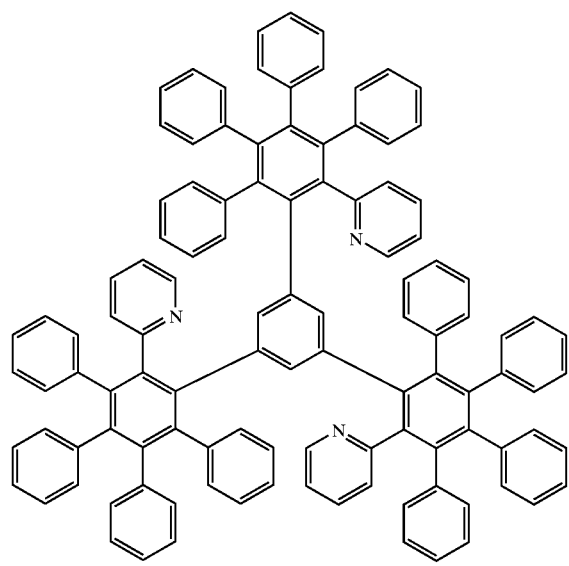
(1-32)
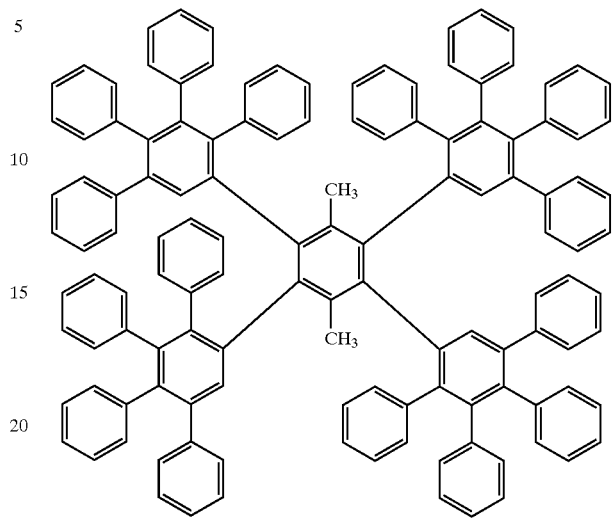
(1-31)
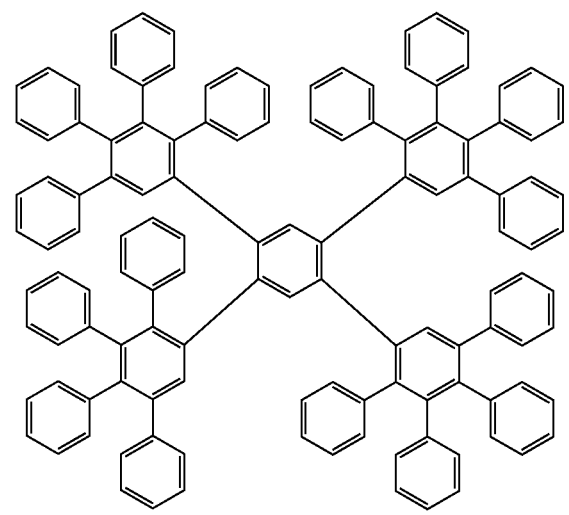
(1-33)
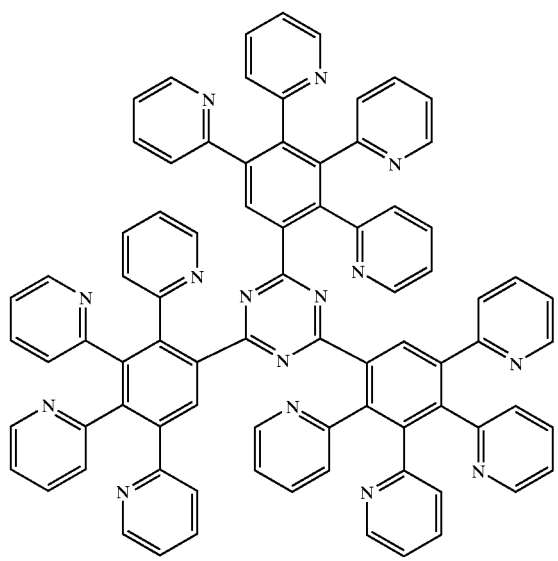

-continued (1-34)

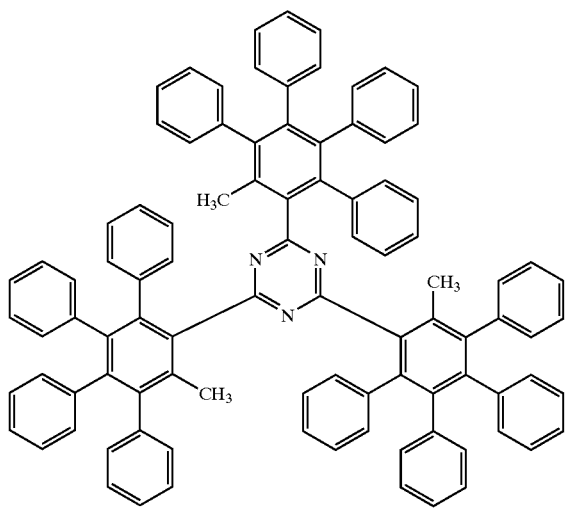

The compound (1) may be synthesized by a known method described in Tetrahedron, 1997, 53, No. 45, page 15349; J. Am. Chem. Soc., 1996, 118, page 741; J. Org. Chem. Soc., 1986, 51, page 979; Angew. Chem. Int. Ed. Engl., 1997, 36, page 631; Indian J. Chem. Sect. B, 2000, 39, page 173; Org. Synth. Coll. Vol. 5, 1973, page 604; Chem. Ber., 1960, 93, page 1769; etc.

The light-emitting device of the present invention utilizes light emission from a triplet excited state (or a triplet exciton). The light emission from the triplet excited state or the triplet exciton is essentially the same as phosphorescence emission. A material that can emit phosphorescence is hereinafter referred to as "phosphorescent material." The light-emitting device of the present invention comprises at least one phosphorescent material. Though the phosphorescent material used in the present invention is not particularly limited, it may comprise a rare earth metal, more preferably be a transition metal complex. A center metal atom of the transition metal complex is not particularly limited. The center metal is preferably iridium, platinum, rhenium or ruthenium, more preferably iridium or platinum, particularly iridium. Alternatively, a center metal atom of the transition metal complex may preferably be a rare earth metal such as indium, ytterbium; a mixture thereof; etc. An ortho-metallation complex is particularly preferably used as the transition metal complex in the present invention. The ortho-metallation complex used in the present invention may be such a complex as described in Akio Yamamoto, "Organometallic Chemistry, Basics and Applications," pages 150 to 232, Shokabo Publishing Co., Ltd., (1982); H. Yersin, "Photochemistry and Photophysics of Coordination Compounds," pages 71 to 77 and 135 to 146, Springer-Verlag, Inc. (1987); etc. In the present invention, a ligand of the transition metal complex preferably has at least one fluorophenylpyridine skeleton and difluorophenylpyridine skeleton.

It is preferable that the phosphorescent material exhibits a phosphorescence quantum yield of 70% or more at 20° C. and a phosphorescence emission peak wavelength $\lambda_{max}$ of 495 nm or less. It is more preferable that the phosphorescence quantum yield is 80% or more at 20° C. and the phosphorescence emission peak wavelength $\lambda_{max}$ is 490 nm or less, and it is particularly preferable that the phosphorescence quantum yield is 85% or more at 20° C. and the phosphorescence emission peak wavelength $\lambda_{max}$ is 480 nm or less.

Although the light-emitting device of the present invention is not particularly limited with respect to a system therefor, a driving method therefor, use thereof, etc., the light-emitting device is preferably such a structure that uses the compound (1) as a charge-transporting material, or that has a layer comprising both of the compound (1) and the phosphorescent material. When the compound (1) and the phosphorescent material are contained in the same layer, the compound (1) acts mainly as a host material. Known as typical light-emitting devices are organic electroluminescence (EL) devices.

The light-emitting device of the present invention comprises a light-emitting layer or a plurality of organic layers comprising a light-emitting layer between a pair of electrodes (a positive electrode and a negative electrode). The light-emitting layer or at least one layer of the organic layers comprises the compound (1). When the compound (1) is used as a host material, the amount of the compound (1) is preferably 50 to 99.9% by mass, more preferably 60 to 99% by mass, based on the total weight of the layer comprising the compound (1). Further, the amount of the compound (1) is preferably 50 to 100% by mass, more preferably 60 to 100% by mass, when the compound (1) is used as a charge-transporting material.

The formation of an organic layer comprising the compound (1) is not particularly limited, and the organic layer may be formed by a resistance-heating vapor deposition method, an electron beam method, a sputtering method, a molecular-stacking method, a coating method, an inkjet method, a printing method, a transferring method, etc. Preferred among the methods are the resistance-heating vapor deposition method, the coating method and the transferring method from the viewpoints of simplicity in production processes and properties of the resultant light-emitting device.

The light-emitting device of the present invention comprises the light-emitting layer, and may further comprise a hole-injecting layer, a hole-transporting layer, an electron-injecting layer, an electron-transporting layer, a protective layer, etc. These layers may have a plurality of functions. The compound (1) may be contained in any of the layers.

In the present invention, it is preferable that a layer comprising a compound having an ionization potential of 5.9 eV or more is disposed between the negative electrode and the light-emitting layer. The ionization potential is particularly preferably 6.0 eV or more, and the layer comprising the compound having the ionization potential particularly preferably acts as the electron-transporting layer.

An emission peak wavelength of the light-emitting device is preferably 390 to 495 nm, more preferably 400 to 490 nm from the viewpoint of blue color purity. The light-emitting device of the present invention may also have an emission peak wavelength at 500 nm or more, and may be used as a white light-emitting device. As for chromaticity shown by the light-emitting device of the present invention, an x value in CIE chromaticity coordinates is preferably 0.22 or less, more preferably 0.20 or less, a y value in CIE chromaticity coordinates is preferably 0.53 or less, more preferably 0.50 or less, from the viewpoint of the blue color purity. Further, in the light-emitting device of the present invention, a half bandwidth of an emission spectrum is preferably 100 nm or less, more preferably 90 nm or less, further preferably 80 nm or less, particularly 70 nm or less from the viewpoint of the blue color purity. Each component of the light-emitting device of the present invention is described in detail below.

(A) Positive Electrode

The positive electrode acts to supply holes to the hole-injecting layer, the hole-transporting layer, the light-emitting layer, etc. The positive electrode is generally made of a pure metal, an alloy, a metal oxide, an electrically conductive compound, a mixture thereof, etc., preferably made of a material having a work function of 4.0 eV or more. Examples of materials for the positive electrode include metals such as gold, silver, chromium and nickel; electrically conductive metal oxides such as tin oxide, zinc oxide, indium oxide and ITO (Indium Tin Oxide); mixtures and laminations of the metal and the electrically conductive metal oxide; electrically conductive inorganic compounds such as copper iodide and copper sulfide; electrically conductive organic compounds such as polyaniline, polythiophene and polypyrrole; laminations of the electrically conductive organic compound and ITO; etc. Preferable among the materials are the electrically conductive metal oxides, particularly ITO, from the viewpoints of productivity, electroconductivity, transparency, etc.

A method for forming the positive electrode may be selected depending on the material used therefor. For example, the positive electrode made of ITO may be formed by an electron beam method, a sputtering method, a resistance-heating vapor deposition method, a chemical reaction method such as a sol-gel method, a coating method using a dispersion containing indium tin oxide, etc. The positive electrode may be subjected to a washing treatment, etc., to lower the driving voltage, or to increase the light-emitting efficiency of the light-emitting device. For example, in the case of the positive electrode of ITO, a UV-ozone treatment and a plasma treatment are effective. The positive electrode preferably has sheet resistance of a few hundred Ω/square or less. Although the thickness of the positive electrode may be appropriately determined depending on the material used therefor, it is in general preferably 10 nm to 5 μm, more preferably 50 nm to 1 μm, particularly 100 to 500 nm.

The positive electrode is generally disposed on a substrate made of a soda lime glass, a non-alkali glass, a transparent resin, etc. The glass substrate is preferably made of non-alkali glass to reduce ion elution. In the case of using the soda lime glass, a barrier coating of silica, etc. is preferably formed thereon beforehand. The thickness of the substrate is not particularly limited as long as it has sufficient strength. In the case of the glass substrate, the thickness of the substrate is generally 0.2 mm or more, preferably 0.7 mm or more.

(B) Negative Electrode

The negative electrode acts to supply electrons to the electron-injecting layer, the electron-transporting layer, the light-emitting layer, etc. Materials for the negative electrode may be selected from pure metals, alloys, metal halides, metal oxides, electrically conductive compounds, mixtures thereof, etc., depending on ionization potential, stability, adhesion to a layer adjacent to the negative electrode such as the light-emitting layer, etc. Examples of materials for the negative electrode include alkali metals such as Li, Na and K, and fluorides and oxides thereof; alkaline earth metals such as Mg and Ca, and fluorides and oxides thereof; gold; silver; lead; aluminum; alloys and mixtures of sodium and potassium; alloys and mixtures of lithium and aluminum; alloys and mixtures of magnesium and silver; rare earth metals such as indium and ytterbium; mixtures thereof; etc.

The negative electrode is preferably made of a material having a work function of 4.0 eV or less, more preferably made of aluminum, an alloy or a mixture of lithium and aluminum, or an alloy and a mixture of magnesium and silver.

The negative electrode may have a single-layer structure or a multi-layer structure. A preferred multi-layer structure is aluminum/lithium fluoride, aluminum/lithium oxide, etc. The negative electrode may be formed by an electron beam method, a sputtering method, a resistance-heating vapor deposition method, a coating method, etc. A plurality of materials may be simultaneously deposited. The negative electrode of an alloy may be formed by simultaneously depositing a plurality of metals, or by depositing their alloy. The negative electrode preferably has a sheet resistance of a few hundred Ω/square or less. Although the thickness of the negative electrode may be appropriately determined depending on the material used therefor, it is in general preferably 10 nm to 5 μm, more preferably 50 nm to 1 μm, particularly 100 nm to 1 μm.

(C) Hole-injecting Layer and Hole-transporting Layer

The hole-injecting material and the hole-transporting material used for the hole-injecting layer and the hole-transporting layer are not particularly limited as long as they have a function to inject holes provided from the positive electrode into the light-emitting layer; transporting the holes to the light-emitting layer; and blocking electrons provided from the negative electrode. Examples of the hole-injecting material and the hole-transporting material include carbazole, triazole, oxazole, oxadiazole, imidazole, polyarylalkanes, pyrazoline, pyrazolone, phenylenediamine, arylamines, amino-substituted chalcone, styrylanthracene, fluorenone, hydrazone, stilbene, silazane, aromatic tertiary amine compounds, styrylamine compounds, aromatic dimethylidyne compounds, porphyrin compounds, polysilane compounds, poly(N-vinylcarbazole), aniline copolymers, electrically conductive polymers and oligomers such as oligothiophenes and polythiophenes, organic silane compounds, the compound (1), derivatives thereof, carbon, etc.

Each of the hole-injecting layer and the hole-transporting layer may be a single layer made of one or more materials, or a multi-layer made of the same or different materials. The hole-injecting layer and the hole-transporting layer may be formed by a vacuum deposition method, an LB method, a coating method using a solution or a dispersion containing the above material such as a spin-coating method, a casting method and a dip-coating method, an ink-jet method, a printing method, a transferring method, etc. A solution and a dispersion used in the coating method may contain a resin. Examples of such resin include poly(vinyl chloride), polycarbonates, polystyrene, poly(methyl methacrylate), poly(butyl methacrylate), polyesters, polysulfones, poly(phenylene oxide), polybutadiene, poly(N-vinylcarbazole), hydrocarbon resins, ketone resins, phenoxy resins, polyamides, ethyl celluloses, poly(vinyl acetate), ABS resins, polyurethanes, melamine resins, unsaturated polyester resins, alkyd resins, epoxy resins, silicone resins, etc. Although the thickness of each of the hole-injecting layer and the hole-transporting layer is not particularly limited, it is in general preferably 1 nm to 5 μm, more preferably 5 nm to 1 μm, particularly 10 to 500 nm.

(D) Light-emitting Layer

In the light-emitting layer, holes injected from the positive electrode, the hole-injecting layer or the hole-transporting layer and electrons injected from the negative electrode, the electron-injecting layer or the electron-transporting layer are recombined to emit light when an electric field is applied to the light-emitting device. Light-emitting materials for the light-emitting layer are not particularly limited as long as they have functions of receiving holes provided from the positive electrode, etc.; receiving electrons provided from the negative electrode, etc.; transporting charges; and recombining holes and electrons to emit light when an electric field is applied to the light-emitting device. Examples of the light-emitting materials include benzoxazole; benzoimidazole; benzothiazole; styrylbenzene; polyphenyl; diphenylbutadiene; tetraphenylbutadiene; naphthalimido; coumarin; perylene; perynone; oxadiazole; aldazine; pyralidine; cyclopentadiene; bis(styryl)anthracene; quinacridon; pyrrolopyridine; thiadiazolopyridine; cyclopentadiene; styrylamine; aromatic dimethylidyne compounds; metal complexes such as 8-quinolinol derivative metal complexes; high-molecular-weight, light-emitting materials such as polythiophene, polyphenylene and polyphenylenevinylene; organic silane compounds; transition metal complexes such as tris(phenylpyridine)-iridium complexes and porphyrin-platinum complexes; derivatives thereof; etc. It should be noted that the light-emitting layer comprises at least one phosphorescent material.

The light-emitting layer may be made of one or more materials. The light-emitting device of the present invention may comprise one or more light-emitting layers. In a case where the light-emitting device comprises a plurality of light-emitting layers, each of the light-emitting layers may be made of one or more materials, and may emit light with a different color to provide white light. The single light-emitting layer may provide white light.

The light-emitting layer may be formed by a resistance-heating vapor deposition method; an electron beam method; a sputtering method; a molecular-stacking method; a coating method such as a spin-coating method, a casting method and a dip-coating method; an inkjet method; a printing method; an LB method; a transferring method; etc. Preferable among them are the resistance-heating vapor deposition method and the coating method. Although the thickness of the light-emitting layer is not particularly limited, it is in general preferably 1 nm to 5 $\mu$m, more preferably 5 nm to 1 $\mu$m, particularly 10 to 500 nm.

(E) Electron-injecting Layer and Electron-transporting Layer

The electron-injecting material and the electron-transporting material used for the electron-injecting layer and the electron-transporting layer are not particularly limited if only they have any function of injecting the electrons provided from the negative electrode into the light-emitting layer; transporting the electrons to the light-emitting layer; and blocking the holes provided from the positive electrode. Examples of the material include triazole; oxazole; oxadiazole; imidazole; fluorenone; anthraquinodimethane; anthrone; diphenylquinone; thiopyran dioxide; carbodimide; fluorenylidenemethane; distyrylpyrazine; anhydrides derived from a tetracarboxylic acid having such an aromatic ring as a naphthalene ring and a perylene ring; phthalocyanine; metal complexes such as 8-quinolinol derivative metal complexes, metallophthalocyanines and metal complexes containing a benzoxazole ligand or a benzothiazole ligand; organic silane compounds; the compound (1); derivatives thereof; etc.

Each of the electron-injecting layer and the electron-transporting layer may have a structure of single-layer made of one or more materials, or multi-layers made of the same or different materials. The electron-injecting layer and the electron-transporting layer may be formed by a vacuum deposition method; an LB method; a coating method using a solution or a dispersion containing the above material such as a spin-coating method, a casting method and a dip-coating method; an ink-jet method; a printing method; a transferring method; etc. The solution and the dispersion used in the coating method may contain a resin. Examples of such resins may be the same as those for the hole-injecting layer and the hole-transporting layer. Although the thickness of each of the electron-injecting layer and the electron-transporting layer is not particularly limited, it is in general preferably 1 nm to 5 $\mu$m, more preferably 5 nm to 1 $\mu$m, particularly 10 to 500 nm.

(F) Protective Layer

The protective layer acts to shield the light-emitting device from the penetration of moisture, oxygen, etc. that deteriorates the device. Examples of materials for the protective layer include metals such as In, Sn, Pb, Au, Cu, Ag, Al, Ti and Ni; metal oxides such as MgO, SiO, $SiO_2$, $Al_2O_3$, GeO, NiO, CaO, BaO, $Fe_2O_3$, $Y_2O_3$ and $TiO_2$; metal fluorides such as $MgF_2$, LiF, $AlF_3$ and $CaF_2$; nitrides such as $SiN_x$ and $SiO_xN_y$; polyethylene; polypropylene; poly(methylmethacrylate); polyimides; polyureas; polytetrafluoroethylene; polychlorotrifluoroethylene; polydichlorodifluoroethylene; copolymers of chlorotrifluoroethylene and dichlorodifluoroethylene; copolymers of tetrafluoroethylene and at least one comonomer; fluorine-containing copolymers having main chains with cyclic structures; moisture-absorbing materials having a water absorption of 1% or more; moisture-resistant materials having a water absorption of 0.1% or less; etc.

A method for forming the protective layer is not particularly limited. The protective layer may be formed by a vacuum deposition method, a sputtering method, an activated sputtering method, a molecular beam epitaxy method (MBE method), a cluster ion beam method, an ion-plating method, a plasma polymerization method, a high-frequency excitation ion-plating method, a plasma CVD method, a laser CVD method, a thermal CVD method, a gas source CVD method, a coating method, a printing method, a transferring method, etc.

The present invention will be specifically described below with reference to Examples without intention of restricting the scope of the present invention.

SYNTHESIS EXAMPLE 1

Synthesis of Compound (1-2)

20 ml of o-xylene was added to 0.5 g of 1-ethynylbenzene and 1.88 g of tetraphenylcyclopentadienone, and the resultant reaction mixture was stirred under reflux for 3 hours. The reaction mixture was cooled to room temperature, and 100 ml of methanol was added thereto to precipitate a solid. The solid was separated by filtration, and purified by recrystallization (chloroform/methanol) three times, to prepare 1.9 g of compound (1-2) as a white solid. Compound (1-2) thus obtained was measured with respect to mass spectrum to confirm its structure.

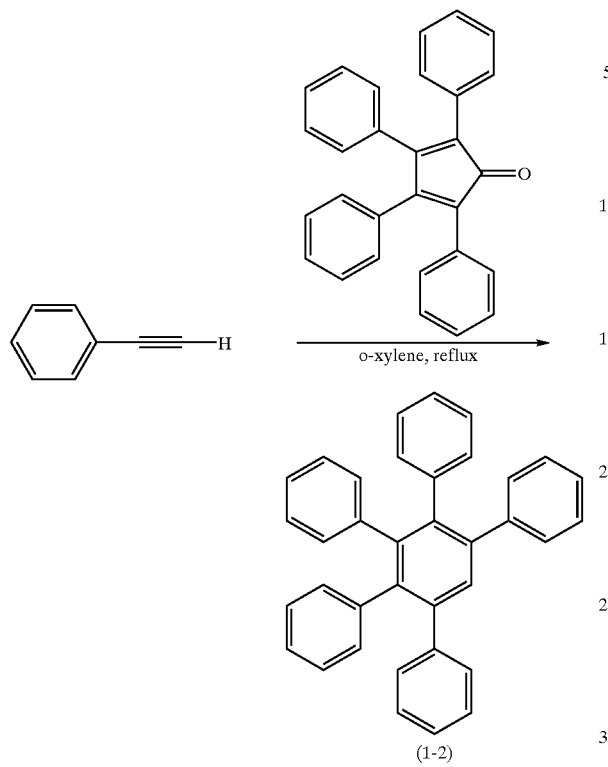

(1-2)

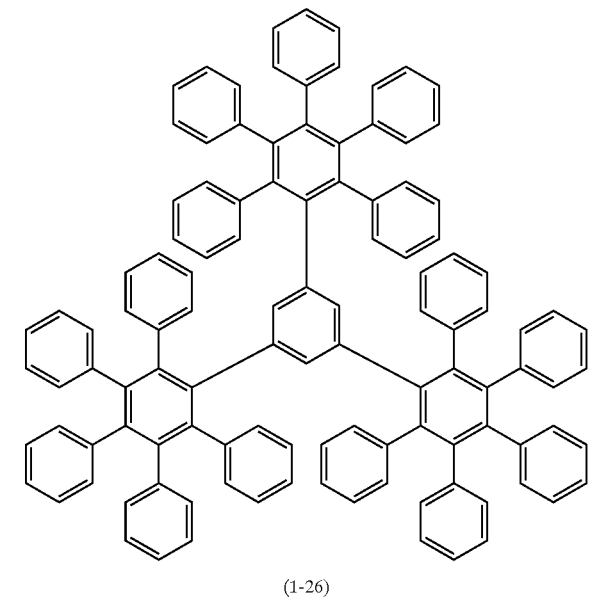

(1-26)

SYNTHESIS EXAMPLE 2

Synthesis of Compound (1-26)

20 ml of diphenyl ether was added to 0.5 g of 1,3,5-tris(phenylethynyl)benzene and 0.51 g of tetraphenylcyclopentadienone, and the resultant reaction mixture was stirred under reflux for 3 hours. The reaction mixture was cooled to room temperature, and 100 ml of methanol was added thereto to precipitate a solid. The solid was separated by filtration, and purified by silica gel column chromatography (chloroform) and by recrystallization (chloroform/methanol), to prepare 0.8 g of compound (1-26) as a white solid. Compound (1-26) thus obtained was measured with respect to mass spectrum to confirm the structure.

COMPARATIVE EXAMPLE 1

With a washed ITO substrate placed in a deposition apparatus, N,N'-diphenyl-N,N'-di(m-tolyl)benzidine (TPD) was vapor-deposited in a thickness of 40 nm on the ITO substrate. The following Compounds a and b were co-deposited in a thickness of 20 nm at a weight ratio of Compound a/Compound b of 17/1 thereon, and further, the following azole compound (Compound c) was vapor-deposited in a thickness of 40 nm thereon, to form an organic thin film. A mask patterned for a desired light-emitting area of 4 mm×5 mm was disposed on the organic thin film, magnesium and silver were co-deposited at a weight ratio of magnesium/silver of 10/1 in a thickness of 50 nm on the organic thin film in the deposition apparatus, and silver was further vapor-deposited in a thickness of 50 nm thereon, to produce a light-emitting device of Comparative Example 1.

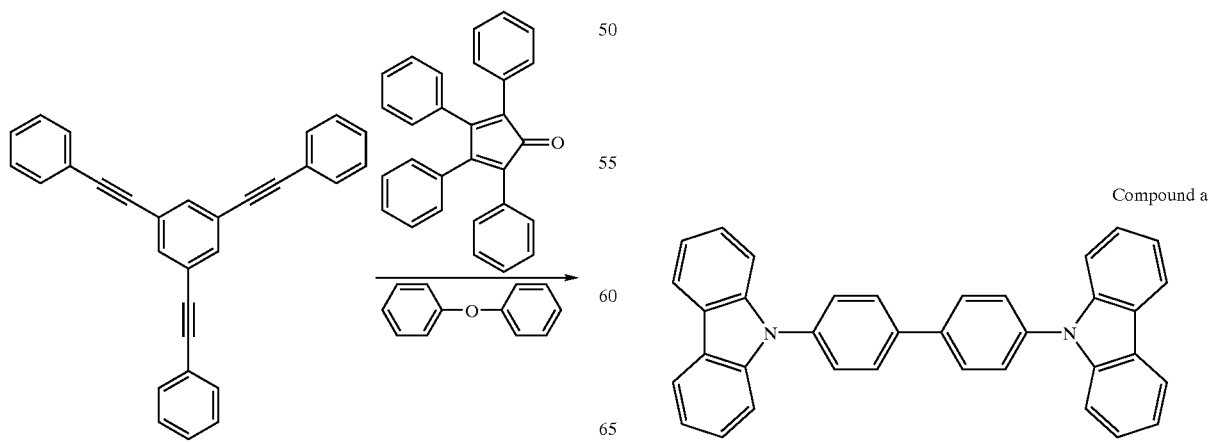

Compound a

Compound b

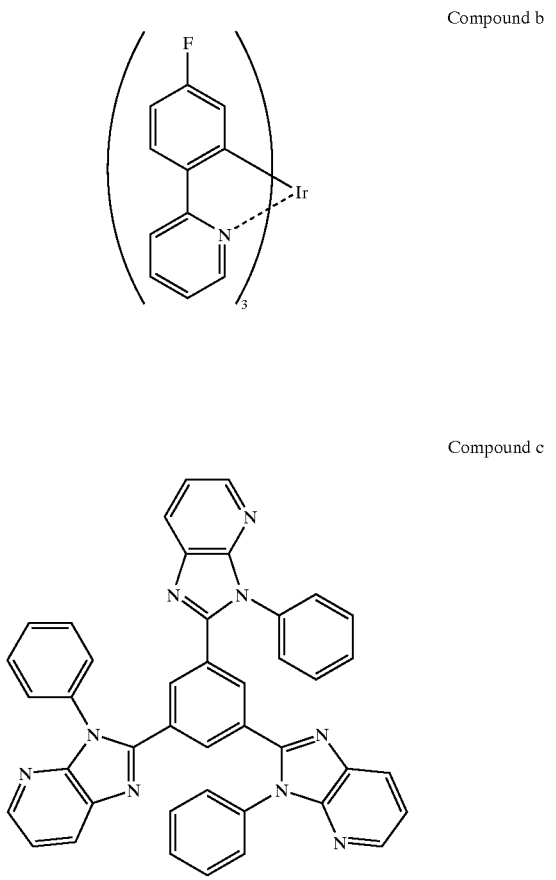

Compound c

Compound f

DC voltage was applied to the light-emitting device of Comparative Example 1 by "Source-Measure Unit 2400" available from Toyo Corporation to cause it to emit light, which was measured with respect to luminance and emission wavelength. The luminance was measured by "Luminance Meter BM-8" available from Topcon Corporation, and the emission wavelength was measured by "Spectral Analyzer PMA-11" available from Hamamatsu Photonics K.K. As a result, it was found that the light-emitting device of Comparative Example 1 emitted a blue light with a chromaticity of (0.21, 0.53) and exhibited an external quantum efficiency of 1.2%. It should be noted that the external quantum efficiency was obtained by luminance, emission spectrum, current density and luminosity curve.

COMPARATIVE EXAMPLE 2

A light-emitting device of Comparative Example 2 was produced and measured with respect to luminance and emission wavelength in the same manner as in Comparative Example 1 except for using the following Compound f in place of Compound b. As a result, it was found that the light-emitting device of Comparative Example 2 emitted a blue light with a chromaticity of (0.18, 0.38) and exhibited an external quantum efficiency of 0.3%.

EXAMPLE 1

A light-emitting device of Example 1 was produced and measured with respect to luminance and emission wavelength in the same manner as in Comparative Example 1 except for using Compound (1-1) in place of Compound a. As a result, it was found that the light-emitting device of Example 1 emitted a blue light with a chromaticity of (0.19, 0.51) and exhibited an external quantum efficiency of 8.3%.

EXAMPLE 2

A light-emitting device of Example 2 was produced in the same manner as in Comparative Example 2 except for using Compound (1-1) in place of Compound a, and measured with respect to luminance and emission wavelength in the same manner as in Comparative Example 1. As a result, it was found that the light-emitting device of Example 2 emitted a blue light with a chromaticity of (0.15, 0.37) and exhibited an external quantum efficiency of 6.3%.

EXAMPLE 3

A light-emitting device of Example 3 was produced and measured with respect to luminance and emission wavelength in the same manner as in Comparative Example 1 except for using Compound (1-26) in place of Compound a. As a result, it was found that the light-emitting device of Example 3 emitted a blue light with a chromaticity of (0.20, 0.51) and exhibited an external quantum efficiency of 8.0%.

EXAMPLE 4

A light-emitting device of Example 4 was produced and measured with respect to luminance and emission wavelength in the same manner as in Comparative Example 1 except for using Compound (1-18) in place of Compound a. As a result, it was found that the light-emitting device of Example 4 emitted a blue light with a chromaticity of (0.20, 0.52) and exhibited an external quantum efficiency of 5.1%.

EXAMPLE 5

An organic thin film was formed in the same manner as in Comparative Example 1 except that Compound (1-1) was used in place of Compound a, and that following Compound d was used in place of Compound c. A mask patterned for a desired light-emitting area of 4 mm×5 mm was disposed on the organic thin film, lithium fluoride was vapor-deposited in a thickness of 3 nm on the organic thin film in the deposition apparatus, and aluminum was further vapor-deposited in a thickness of 60 nm thereon, to produce a light-emitting device of Example 5. The light-emittingdevice of Example 5 was measured with respect to luminance and emission wavelength in the same manner as in Comparative Example 1. As a result, it was found that the light-emitting device of Example 5 emitted a blue light with a chromaticity of (0.21, 0.51) and exhibited an external quantum efficiency of 10.0%.

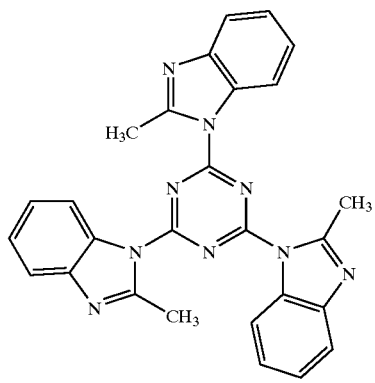

Compound d

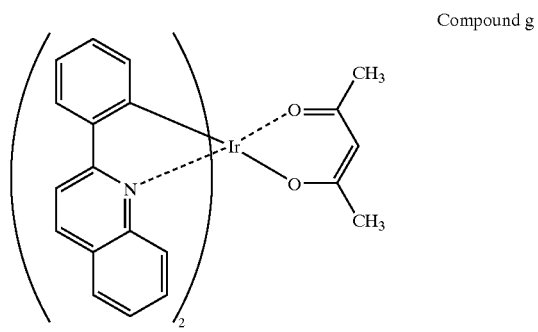

Compound g

EXAMPLE 6

An organic thin film was formed in the same manner as in Comparative Example 2 except that Compound (1-1) was used in place of Compound a, and that Compound d was used in place of Compound c. A mask patterned for a desired light-emitting area of 4 mm×5 mm was disposed on the organic thin film, lithium fluoride was vapor-deposited in a thickness of 3 nm on the organic thin film in the deposition apparatus, and aluminum was further vapor-deposited in a thickness of 60 nm thereon, to produce a light-emitting device of Example 6. The light-emitting device of Example 6 was measured with respect to luminance and emission wavelength in the same manner as in Comparative Example 1. As a result, it was found that the light-emitting device of Example 6 emitted a blue light with a chromaticity of (0.16, 0.36) and exhibited an external quantum efficiency of 8.2%.

EXAMPLE 7

With a washed ITO substrate placed in a deposition apparatus, TPD was vapor-deposited in a thickness of 40 nm on the ITO substrate, and the compound (1-21) and following Compound g were co-deposited in a thickness of 5 nm at a weight ratio of Compound (1-21)/Compound g of 17/1 thereon. Compound (1-1) and Compound b were then co-deposited in a thickness of 15 nm at a weight ratio of Compound (1-1)/Compound b of 17/1 thereon, and an azole compound (Compound d) was further vapor-deposited in a thickness of 40 nm thereon, to form an organic thin film. A mask patterned for a desired light-emitting area of 4 mm×5 mm was disposed on the organic thin film, lithium fluoride was vapor-deposited in a thickness of 3 nm on the organic thin film in the deposition apparatus, and aluminum was further vapor-deposited in a thickness of 60 nm thereon, to produce a light-emitting device of Example 7. The light-emitting device of Example 7 was measured with respect to luminance and emission wavelength in the same manner as in Comparative Example 1. As a result, it was found that the light-emitting device of Example 7 emitted a white light with a chromaticity of (0.31, 0.32) and exhibited an external quantum efficiency $\phi_{EL}$ of 5.2%.

EXAMPLE 8

A washed ITO substrate was spin-coated with "Baytron P" (solution of PEDOT-PSS, poly(ethylenedioxythiophene) doped with polystyrene sulfonic acid, available from BAYER AG.) under the conditions of 1,000 rpm and 30 sec, and vacuum-dried at 150° C. for 1.5 hours, to form an organic layer having a thickness of 70 nm. An organic layer thus obtained was spin-coated with a mixture of 18 mg of Compound (1-26) and 2 mg of Compound b in 1.5 ml of dichloroethane, to form an organic thin film having a thickness of 110 nm. Compound d was vapor-deposited in vacuum in a thickness of 40 nm on the organic thin film. With a mask patterned for a desired light-emitting area of 4 mm×5 mm disposed thereon, lithium fluoride was vapor-deposited in a thickness of 3 nm thereon, and aluminum was further vapor-deposited in a thickness of 60 nm thereon in the deposition apparatus, to produce a light-emitting device of Example 8. The light-emitting device of Example 8 was measured with respect to luminance and emission wavelength in the same manner as in Comparative Example 1. As a result, it was found that the light-emitting device of Example 8 emitted a blue light and exhibited a maximum luminance of 1,100 cd/m².

As described above in detail, the light-emitting device of the present invention exhibits high external quantum efficiency and excellent light-emitting properties, and can be used as a blue light-emitting device or a white light-emitting device with high color purity useful for indicating elements, display devices, backlights, electro-photographs, illumination light sources, recording light sources, exposing light sources, reading light sources, road signs and markings, signboards, interiors, optical communications, etc.

What is claimed is:

1. A light-emitting device comprising a pair of electrodes and one or more organic layers disposed between said electrodes, said one or more organic layers comprising a light-emitting layer, wherein said light-emitting device utilizes a triplet exciton for light emission and comprises at least one compound represented by the formula (1):

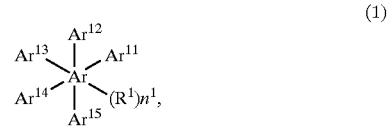

wherein each of $Ar^{11}$, $Ar^{12}$, $Ar^{13}$, $Ar^{14}$ and $Ar^{15}$ represents a pyridyl group, a pyrazinyl group, a pyrimidyl group, or a triazinyl group; Ar represents an aryl group; $R^1$ represents a substituent; and $n^1$ represents an integer of 0 or more.

2. The light-emitting device of claim 1, wherein Ar represents a phenyl group, a naphthyl group, a phenanthryl group or an anthryl group.

3. The light-emitting device of claim 1, wherein $n^1$ represents an integer of 0 to 5.

4. The light-emitting device of claim 3, wherein $n^1$ is 1.

5. The light-emitting device of claim 1, wherein said compound is represented by the formula (2):

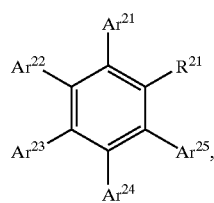

(2)

wherein each of $Ar^{21}$, $Ar^{22}$, $Ar^{23}$, $Ar^{24}$ and $Ar^{25}$ represents pyridyl group, a pyrazinyl group, a pyrimidyl group, or a triazinyl group; and $R^{21}$ represents a hydrogen atom or a substituent.

6. The light-emitting device of claim 5, wherein $R^{21}$ represents an alkyl group, an aryl group or a heteroaryl group.

7. The light-emitting device of claim 1, wherein the organic layer comprising the compound represented by the formula (1) is formed by a coating method.

8. The light-emitting device of claim 1, wherein the organic layer comprising the compound represented by the formula (1) is a light-emitting layer.

9. The light-emitting device of claim 1, wherein the organic layer comprising the compound represented by the formula (1) is a hole-transporting layer.

10. The light-emitting device of claim 1, wherein the organic layer comprising the compound represented by the formula (1) is an electron-transporting layer.

11. The light-emitting device of claim 1, wherein a $T_1$ level, an energy level at the lowest triplet excited state, of the compound represented by the formula (1) is 60 to 90 kcal/mol.

12. The light-emitting device of claim 1, wherein said light-emitting device exhibits an emission peak in a wavelength range of 390 to 495 nm.

13. The light-emitting device of claim 1, wherein the content of said compound represented by the formula (1) in the organic layers comprising the compound of formula (1) is 50 to 99.9% by mass as a host material.

14. The light-emitting device of claim 1, wherein the content of said compound represented by the formula (1) in the organic layer comprising the compound of formula (1) is 50 to 100% by mass as a charge-transporting material.

15. The light-emitting device of claim 1, wherein said light-emitting device utilizes a transition metal complex in a triplet excited state for light emission.

16. The light-emitting device of claim 15, wherein a center metal of said transition metal complex is a rare earth metal.

17. The light-emitting device of claim 15, wherein a center metal of said transition metal complex is selected from the group consisting of iridium, platinum, rhenium and ruthenium.

18. The light-emitting device of claim 15, wherein the transition metal complex is an ortho-metallation complex.

19. A light-emitting device comprising a pair of electrodes and one or more organic layers disposed between said electrodes, said one or more organic layers comprising a light-emitting layer, wherein said light-emitting device utilizes a triplet exciton for light emission and comprises at least one compound represented by the formula (1):

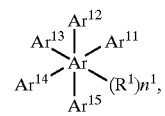

(1)

wherein each of $Ar^{11}$, $Ar^{12}$, $Ar^{13}$, $Ar^{14}$ and $Ar^{15}$ represents an aryl group or a heteroaryl group and at least one of $Ar^{11}$, $Ar^{12}$, $Ar^{13}$, $Ar^{14}$ and $Ar^{15}$ represents a heteroaryl group; Ar represents a phenyl group, a naphthyl group, a phenanthryl group or an anthryl group; $R^1$ represents a substituent; and $n^1$ represents an integer of 0 or more.

20. The light-emitting device of claim 19, wherein at least one of $Ar^{11}$, $Ar^{12}$, $Ar^{13}$, $Ar^{14}$ and $Ar^{15}$ represents a pyridyl group, a pyrazinyl group, a pyrimidyl group or a triazinyl group.

21. The light-emitting device of claim 19, wherein $n^1$ represents an integer of 0 to 5.

22. The light-emitting device of claim 21, wherein $n^1$ is 1.

23. The light-emitting device of claim 19, wherein said compound is represented by the formula (2):

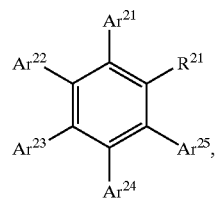

(2)

wherein each of $Ar^{21}$, $Ar^{22}$, $Ar^{23}$, $Ar^{24}$ and $Ar^{25}$ represents an aryl group or a heteroaryl group and at least one of $Ar^{21}$, $Ar^{22}$, $Ar^{23}$ $Ar^{24}$ and $Ar^{25}$ represents a heteroaryl group; and $R^{21}$ represents a hydrogen atom or a substituent.

24. The light-emitting device of claim 23, wherein said at least one of $Ar^{21}$, $Ar^{22}$, $Ar^{23}$ $Ar^{24}$ and $Ar^{25}$ represents a pyridyl group, a pyrazinyl group, a pyrimidyl group or a triazinyl group.

25. The light-emitting device of claim 23, wherein $R^{21}$ represents a hydrogen atom, an alkyl group, an aryl group or a heteroaryl group.

26. The light-emitting device of claim 19, wherein the organic layer comprising the compound represented by the formula (1) is a light-emitting layer.

27. The light-emitting device of claim 19, wherein the organic layer comprising the compound represented by the formula (1) is a hole-transporting layer.

28. The light-emitting device of claim 19, wherein the organic layer comprising the compound represented by the formula (1) is an electron-transporting layer.

29. The light-emitting device of claim 19, wherein a $T_1$ level, an energy level at the lowest triplet excited state, of the compound represented by the formula (1) is 60 to 90 kcal/mol.

30. The light-emitting device of claim 19, wherein said light-emitting device exhibits an emission peak in a wavelength range of 390 to 495 nm.

31. The light-emitting device of claim 19, wherein said light-emitting device utilizes a transition metal complex in a triplet excited state for light emission.

32. A light-emitting device comprising a pair of electrodes and one or more organic layers disposed between said electrodes, said one or more organic layers comprising a light-emitting layer, wherein said light-emitting device utilizes a triplet exciton for light emission and comprises at least one compound represented by the formula (1):

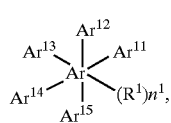

(1)

wherein each of $Ar^{11}$, $Ar^{12}$, $Ar^{13}$, $Ar^{14}$ and $Ar^{15}$ represents an aryl group or a heteroaryl group; Ar represents an aryl group; $R^1$ represents a substituent; and $n^1$ represents an integer of 0, 2, 3, 4 or 5.

33. The light-emitting device of claim 32, wherein Ar represents a phenyl group, a naphthyl group, a phenanthryl group or an anthryl group.

34. The light-emitting device of claim 32, wherein each of $Ar^{11}$ $Ar^{12}$, $Ar^{13}$, $Ar^{14}$ and $Ar^{15}$ represents a phenyl group, a naphthyl group, a phenanthryl group or an anthryl group.

35. The light-emitting device of claim 32, wherein each of $Ar^{11}$ $Ar^{12}$, $Ar^{13}$, $Ar^{14}$ and $Ar^{15}$ represents a pyridyl group, a pyrazinyl group, a pyrimidyl group or a triazinyl group.

36. The light-emitting device of claim 32, wherein said compound is represented by the formula (2):

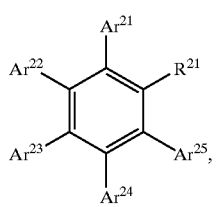

(2)

wherein each of $Ar^{21}$, $Ar^{22}$, $Ar^{23}$ $Ar^{24}$ and $Ar^{25}$ represents an aryl group or a heteroaryl group; and $R^{21}$ represents a hydrogen atom.

37. The light-emitting device of claim 36, wherein each of $Ar^{21}$, $Ar^{22}$, $Ar^{23}$ $Ar^{24}$ and $Ar^{25}$ represents a phenyl group, a naphthyl group, a phenanthryl group or an anthryl group.

38. The light-emitting device of claim 36, wherein each of $Ar^{21}$, $Ar^{22}$, $Ar^{23}$ $Ar^{24}$ and $Ar^{25}$ represents a pyridyl group, a pyrazinyl group, a pyrimidyl group or a triazinyl group.

39. The light-emitting device of claim 32, wherein the organic layer comprising the compound represented by the formula (1) is a light-emitting layer.

40. The light-emitting device of claim 32, wherein the organic layer comprising the compound represented by the formula (1) is a hole-transporting layer.

41. The light-emitting device of claim 32, wherein the organic layer comprising the compound represented by the formula (1) is an electron-transporting layer.

42. The light-emitting device of claim 32, wherein a $T_1$ level, an energy level at the lowest triplet excited state, of the compound represented by the formula (1) is 60 to 90 kcal/mol.

43. The light-emitting device of claim 32, wherein said light-emitting device exhibits an emission peak in a wavelength range of 390 to 495 nm.

44. The light-emitting device of claim 32, wherein said light-emitting device utilizes a transition metal complex in a triplet excited state for light emission.

45. A light-emitting device comprising a pair of electrodes and one or more organic layers disposed between said electrodes, said one or more organic layers comprising a light-emitting layer, wherein said light-emitting device utilizes a triplet exciton for light emission and comprises at least one compound represented by the formula (1):

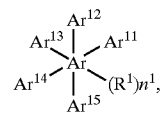

(1)

wherein each of $Ar^{11}$, $Ar^{12}$, $Ar^{13}$, $Ar^{14}$ and $Ar^{15}$ represents an aryl group or a heteroaryl group and at least one of $Ar^{11}$, $Ar^{12}$, $Ar^{13}$, $Ar^{14}$ and $Ar^{15}$ represents a naphthyl group, a phenanthryl group, an anthryl group, a perylenyl group, a chrysenyl group or a triphenylenyl group; Ar represents an aryl group; $R^1$ represents a substituent; and $n^1$ represents an integer of 0 or more.

46. The light-emitting device of claim 45, wherein Ar represents a phenyl group, a naphthyl group, a phenanthryl group or an anthryl group.

47. The light-emitting device of claim 45, wherein said compound is represented by the formula (2):

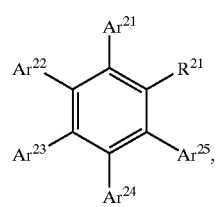

(2)

wherein each of $Ar^{21}$, $Ar^{22}$ $Ar^{23}$ $Ar^{24}$ and $Ar^{25}$ represents an aryl group or a heteroaryl group, at least one of $Ar^{21}$, $Ar^{22}$, $Ar^{23}$ $Ar^{24}$ and $Ar^{25}$ represents a naphthyl group, a phenanthryl group, an anthryl group, a perylenyl group, a chrysenyl group or a triphenylenyl group; and $R^{21}$ represents a hydrogen atom.

48. The light-emitting device of claim 45, wherein the organic layer comprising the compound represented by the formula (1) is a light-emitting layer.

49. The light-emitting device of claim 45, wherein the organic layer comprising the compound represented by the formula (1) is a hole-transporting layer.

50. The light-emitting device of claim 45, wherein the organic layer comprising the compound represented by the formula (1) is an electron-transporting layer.

51. The light-emitting device of claim 45, wherein a $T_1$ level, an energy level at the lowest triplet excited state, of the compound represented by the formula (1) is 60 to 90 kcal/mol.

52. The light-emitting device of claim 45, wherein said light-emitting device exhibits an emission peak in a wavelength range of 390 to 495 nm.

53. The light-emitting device of claim 45, wherein said light-emitting device utilizes a transition metal complex in a triplet excited state for light emission.

54. A light-emitting device comprising a pair of electrodes and one or more organic layers disposed between said electrodes, said one or more organic layers comprising a light-emitting layer, wherein said light-emitting device utilizes a triplet exciton for light emission and comprises at least one compound represented by the formula (1):

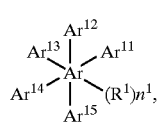

(1)

wherein each of $Ar^{11}$, $Ar^{12}$, $Ar^{13}$, $Ar^{14}$ and $Ar^{15}$ represents an aryl group or a heteroaryl group; each of $Ar^{11}$, $Ar^{12}$, $Ar^{13}$, $Ar^{14}$ and $Ar^{15}$ are unsubstituted or substituted by one or more groups, which is selected from the group consisting of alkyl group, alkenyl group, alkynyl group, aryl group, unsubstituted amino group, methylamino group, dimethylamino group, diethylamino group, dibenzylamino group, alkoxy group, aryloxy group, heteroaryloxy group, acyl group, alkoxycarbonyl group, aryloxycarbonyl group, acyloxy group, acylamino group, alkoxycarbonylamino group, aryloxycarbonylamino group, sulfonylamino group, sulfamoyl group, carbamoyl group, alkylthio group, arylthio group, heteroarylthio group, sulfonyl group, sulfinyl group, ureide group, phosphoric amide group, a nitro group, an imino group, heterocyclic group having an oxygen atom, heterocyclic group having a sulfur atom, imidazolyl group, a pyridyl group, a quinolyl group, a benzoxazolyl group, an azepinyl group and silyl group; Ar represents an aryl group; $R^1$ represents a substituent; and $n^1$ represents an integer of 0 or more.

55. The light-emitting device of claim 54, wherein each of $A^{11}$, $Ar^{12}$, $Ar^{13}$, $Ar^{14}$ and $Ar^{15}$ represents a phenyl group, a naphthyl group, a phenanthryl group, an anthryl group, a perylenyl group, a chrysenyl group or a triphenylenyl group.

56. The light-emitting device of claim 54, wherein each of $Ar^{11}$, $Ar^{12}$, $Ar^{13}$, $Ar^{14}$ and $Ar^{15}$ represents a pyridyl group, a pyrazinyl group, a pyrimidyl group or a triazinyl group.

57. The light-emitting device of claim 54, wherein Ar represents a phenyl group, a naphthyl group, a phenanthryl group or an anthryl group.

58. The light-emitting device of claim 54, wherein $n^1$ represents an integer of 0 to 5.

59. The light-emitting device of claim 54, wherein said compound is represented by the formula (2):

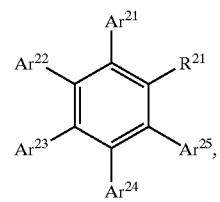

(2)

wherein each of $Ar^{21}$, $Ar^{22}$, $Ar^{23}$ $Ar^{24}$ and $Ar^{25}$ represents an aryl group or a heteroaryl group; each of $Ar^{21}$, $Ar^{22}$, $Ar^{23}$ $Ar^{24}$ and $Ar^{25}$ are unsubstituted or substituted by one or more groups, which is selected from the group consisting of alkyl group, alkenyl group, alkynyl group, aryl group, unsubstituted amino group, methylamino group, dimethylamino group, diethylamino group, dibenzylamino group, alkoxy group, aryloxy group, heteroaryloxy group, acyl group, alkoxycarbonyl group, aryloxycarbonyl group, acyloxy group, acylamino group, alkoxycarbonylamino group, aryloxycarbonylamino group, sulfonylamino group, sulfamoyl group, carbamoyl group, alkylthio group, arylthio group, heteroarylthio group, sulfonyl group, sulfinyl group, ureide group, phosphoric amide group, a nitro group, an imino group, heterocyclic group having an oxygen atom, heterocyclic group having a sulfur atom, imidazolyl group, a pyridyl group, a quinolyl group, a benzoxazolyl group, an azepinyl group and silyl group; and $R^{21}$ represents a hydrogen atom or a substituent.

60. The light-emitting device of claim 59, wherein each of $Ar^{21}$, $Ar^{22}$, $Ar^{23}$ $Ar^{24}$ and $Ar^{25}$ represents a phenyl group, a naphthyl group, a phenanthryl group, an anthryl group, a perylenyl group, a chrysenyl group or a triphenylenyl group.

61. The light-emitting device of claim 59, wherein each of $Ar^{21}$, $Ar^{22}$, $Ar^{23}$ $Ar^{24}$ and $Ar^{25}$ represents a pyridyl group, a pyrazinyl group, a pyrimidyl group or a triazinyl group.

62. The light-emitting device of claim 59, wherein $R^{21}$ represents a hydrogen atom, an alkyl group, an aryl group or a heteroaryl group.

63. The light-emitting device of claim 59, wherein said compound is represented by the formula (3):

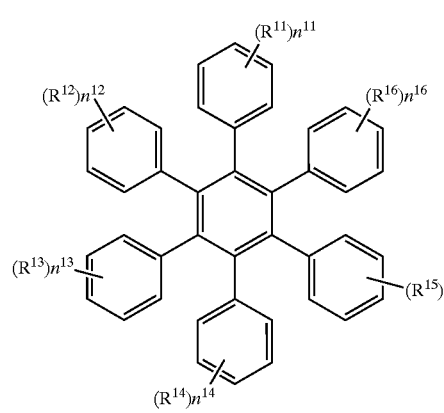

(3)

wherein each of $R^{11}$, $R^{12}$, $R^{13}$, $R^{14}$, $R^{15}$ and $R^{16}$ is selected from the group consisting of alkyl group, alkenyl group, alkynyl group, aryl group, unsubstituted amino group, methylamino group, dimethylamino group, diethylamino group, dibenzylamino group, alkoxy group, aryloxy group, heteroaryloxy group, acyl group, alkoxycarbonyl group, aryloxycarbonyl group, acyloxy group, acylamino group, alkoxycarbonylamino group, aryloxycarbonylamino group, sulfonylamino group, sulfamoyl group, carbamoyl group, alkylthio group, arylthio group, heteroarylthio group, sulfonyl group, sulfinyl group, ureide group, phosphoric amide group, a nitro group, an imino group, heterocyclic group having an oxygen atom, heterocyclic group having a sulfur atom, imidazolyl group, a pyridyl group, a quinolyl group, a benzoxazolyl group, an azepinyl group and silyl group; and $n^{11}$, $n^{12}$, $n^{13}$, $n^{14}$, $n^{15}$ and $n^{16}$ represent an integer of 0 to 5.

64. The light-emitting device of claim 63, wherein each of $R^{11}$, $R^{12}$, $R^{13}$, $R^{14}$, $R^{15}$ and $R^{16}$ is selected from the group consisting of alkyl group, alkenyl group, alkynyl group, aryl group, unsubstituted amino group, methylamino group, dimethylamino group, diethylamino group, dibenzylamino group, alkoxy group, aryloxy group, heteroaryloxy group, acyl group, alkoxycarbonyl group, aryloxycarbonyl group, acyloxy group, acylamino group, alkoxycarbonylamino group, aryloxycarbonylamino group, sulfonylamino group, sulfamoyl group, carbamoyl group, alkylthio group, arylthio group, heteroarylthio group, sulfonyl group, sulfinyl group, ureide group, phosphoric amide group, a nitro group, an imino group, a pyridyl group, a quinolyl group and silyl group; and $n^{11}$, $n^{12}$, $n^{13}$, $n^{14}$, $n^{15}$ and $n^{16}$ represent an integer of 0 to 5.

65. The light-emitting device of claim 54, wherein the organic layer comprising the compound represented by the formula (1) is a light-emitting layer.

66. The light-emitting device of claim 54, wherein the organic layer comprising the compound represented by the formula (1) is a hole-transporting layer.

67. The light-emitting device of claim 54, wherein the organic layer comprising the compound represented by the formula (1) is an electron-transporting layer.

68. The light-emitting device of claim 54, wherein a $T_1$ level, an energy level at the lowest triplet excited state, of the compound represented by the formula (1) is 60 to 90 kcal/mol.

69. The light-emitting device of claim 54, wherein said light-emitting device exhibits an emission peak in a wavelength range of 390 to 495 nm.

70. The light-emitting device of claim 54, wherein said light-emitting device utilizes a transition metal complex in a triplet excited state for light emission.

71. A light-emitting device comprising a pair of electrodes and one or more organic layers disposed between said electrodes, said one or more organic layers comprising a light-emitting layer and said light-emitting layer comprising at least one phosphorescent material, said light-emitting device utilizes a triplet exciton for light emission and comprises at least one compound represented by the formula (1):

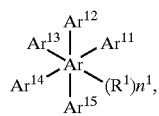

(1)

wherein each of $Ar^{11}$, $Ar^{12}$, $Ar^{13}$, $Ar^{14}$ and $Ar^{15}$ represents an aryl group or a heteroaryl group; Ar represents an aryl group; $R^1$ represents a substituent; and $n^1$ represents an integer of 0 or more, and further comprises at least one compound comprising a triazole unit, triazine unit or imidazole unit.

72. The light-emitting device of claim 71, wherein the at least one compound represented by formula (1) is represented by the formula (2):

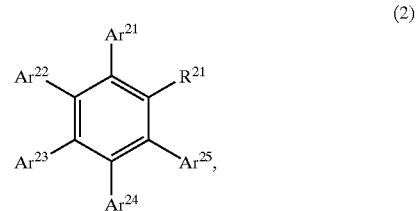

(2)

wherein each of $Ar^{21}$, $Ar^{22}$, $Ar^{23}$, $Ar^{24}$ and $Ar^{25}$ represents an aryl group or a heteroaryl group; and $R^{21}$ represents a hydrogen atom or a substituent.

73. The light-emitting device of claim 72, wherein the at least one compound represented by formula (2) is represented by the formula (3):

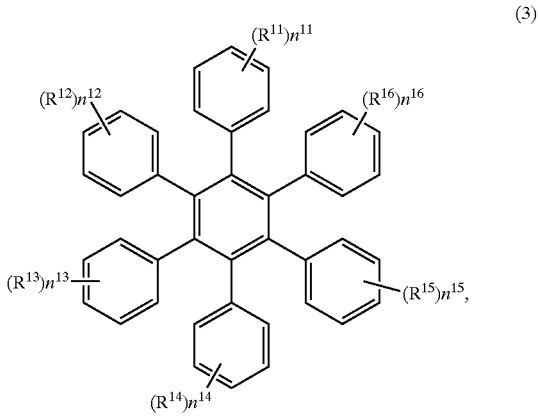

(3)

wherein each of R11, $R^{12}$, $R^{13}$, $R^{14}$, $R^{15}$ and $R^{16}$ represents a substituent; and each of $n^{11}$, $n^{12}$, $n^{13}$, $n^{14}$, $n^{15}$ and $n^{16}$ represents an integer of 0 to 5.

74. The light-emitting device of claim 71, wherein an organic layer comprising said at least one compound comprising a triazole unit, triazine unit or imidazole unit is an electron-injecting or electron-transporting layer.

75. A light-emitting device comprising a pair of electrodes and one or more organic layers disposed between said electrodes, said one or more organic layers comprising a light-emitting layer, wherein said light-emitting device utilizes a triplet exciton for light emission and comprises at least one compound represented by the formula (1):

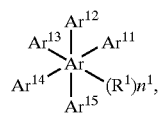
(1)
wherein each of $Ar^{11}$, $Ar^{12}$, $Ar^{13}$, $Ar^{14}$ and $Ar^{15}$ represents an aryl group or a heteroaryl group and at least one of $Ar^{11}$, $Ar^{12}$, $Ar^{13}$, $Ar^{14}$ and $Ar^{15}$ represents a pyridyl group, a pyrazinyl group, a pyrimidyl group or a triazinyl group; Ar represents an aryl group; $R^1$ represents a substituent; and $n^1$ represents an integer of 0 or more.
* * * * *